United States Patent [19]

Gay

[11] 4,429,239
[45] Jan. 31, 1984

[54] COMBINED PHASE DETECTOR AND LOW PASS FILTER

[75] Inventor: Michael J. Gay, Coppet, Switzerland

[73] Assignee: Motorola, Inc., Schaumburg, Ill.

[21] Appl. No.: 357,948

[22] Filed: Mar. 15, 1982

[51] Int. Cl.³ ............... H03H 11/00; H03K 5/159; H03K 5/00
[52] U.S. Cl. ............... 307/520; 307/510; 307/352; 307/583; 328/127
[58] Field of Search ............... 307/520, 510, 582, 583, 307/246, 352; 328/127; 330/9, 107

[56] References Cited

U.S. PATENT DOCUMENTS

| | | | |
|---|---|---|---|
| 4,179,665 | 12/1979 | Gregorian | 330/107 |
| 4,195,266 | 3/1980 | Bingham | 330/9 |
| 4,331,894 | 5/1982 | Gregorian et al. | 307/520 |
| 4,338,571 | 7/1982 | Young | 330/107 |
| 4,365,204 | 12/1982 | Haque | 328/127 |

OTHER PUBLICATIONS

Martin et al., "Switched Capacitor Building Blocks for Adaptive Systems," IEEE Transactions on Circuits and Systems, vol. CAS-28, No. 6, Jun. 1981, pp. 576-584.

Primary Examiner—John S. Heyman
Assistant Examiner—Timothy P. Callahan
Attorney, Agent, or Firm—Joe E. Barbee

[57] ABSTRACT

A combined phase detector and low pass filter comprises charge storage means (10) which is responsive to an input signal (VI) and which is charged to a level dependent upon the magnitude and phase of the input signal in response to a first control signal (S1) which is a digital signal of given frequency. The potential stored in the charge storage means (10) is alternatively gated out by first and second gating circuits (12,14) into an integrating circuit (16) having an output VO. The gating circuits are connected such that the polarity of the connection of the stored potential to the integrating circuit is alternated. The gating circuits are responsive to second and third control signals (S2, S3), respectively, the second and third control signals having a frequency one-half that of the first control signal, and the phase difference between the second and third control signals being 180 degrees. The rate of increase in magnitude of the output signal (VO) represents the phase difference between the input signal and the first control signal.

18 Claims, 3 Drawing Figures

COMBINED PHASE DETECTOR AND LOW PASS FILTER

TECHNICAL FIELD

This invention relates generally to an electronic circuit, and, in particular, to a combined phase detector and low pass filter.

BACKGROUND OF THE INVENTION

The present invention concerns an electronic circuit which functions simultaneously as a phase detector and low pass filter. Phase detectors of various types are well known in the electronic arts. They find utility, among other places, in circuits for decoding stereophonic signals in stereophonic equipment such as tape recorders, phonographs, and radios.

Low pass filters are also well known in the electronic arts, and they find utility in a wide variety of electronic signal processing circuits.

Prior art phase detector circuits have been fabricated in partially integrated circuit form, but until the present invention certain of the circuit components have had to be connected to the integrated circuit off-chip, thus considerably increasing the cost of the phase detector circuit in the particular application.

The combined phase detector and low pass filter of the present invention may be fabricated in a completely integrated circuit form. Thus the external components necessary in prior art circuits can be completely eliminated. The result is a circuit of substantially increased commercial importance.

BRIEF SUMMARY OF THE INVENTION

Accordingly, it is an object of the present invention to provide an improved phase detector.

It is also an object of the present invention to provide an improved low pass filter.

It is a further object of the present invention to provide a combined phase detector and low pass filter in completely integrated form on a single silicon chip.

These and other objects are achieved in accordance with a preferred embodiment of the invention by providing a combined phase detector and low pass filter comprising charge storage means responsive to an input signal and to a first control signal, the first control signal having a first frequency, the charge storage means having first and second output signals of opposite polarity first gating means reponsive to the charge storage means output signals for gating or blocking such signals in response to a second control signal, such second control signal having a frequency one-half the frequency of the first control signal, second gating means responsive to the charge storage means output signals for gating or blocking such signals in response to a third control signal, such third control signal having a frequency one-half that of the first control signal, such second and third control signals being 180 degrees out of phase with respect to each other, and integrating means having first and second input terminals, such terminals being responsive to the charge storage means output signals when such signals are gated by the first and second gating means, the connection of the charge storage means output signals to the integrating means input terminals being reversed in polarity through said first and second gating means, such integrating means integrating the signals applied to its input terminals and generating an output signal, the magnitude of such output signal being indicative of the phase difference between the input signal and the first control signal.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE INVENTION

Figure 1:
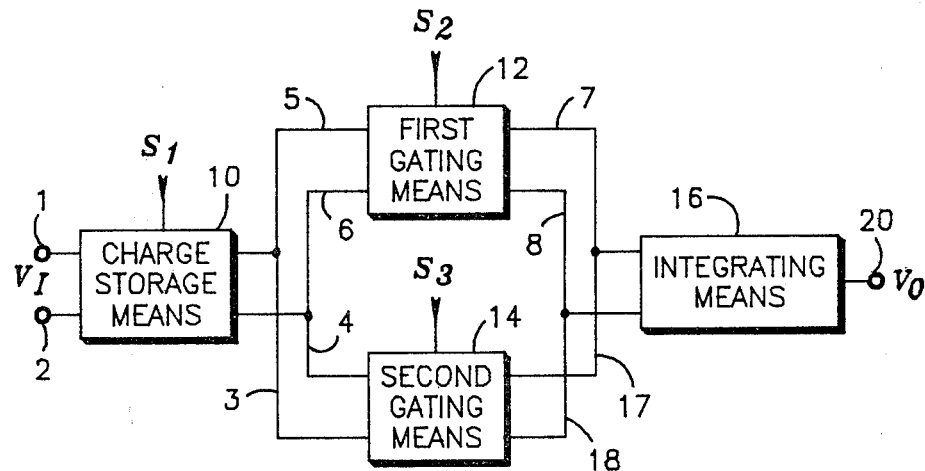
FIG. 1 shows a block diagram illustrating a preferred embodiment of a combined phase detector and low pass filter of the present invention.

Referring now to FIG. 1, a block diagram of the combined phase detector and low pass filter of the present invention is shown.

Charge storage means 10 has two input terminals 1 and 2 across which an input signal VI is applied. Input signal VI can in the usual instance be an alternating current signal. Charge storage means 10 is also responsive to a first control signal S1. Charge storage means 10 accumulates a charge in response to the application of input signal VI, which signal is gated in upon receipt of control signal S1. The charge stored in charge means 10 is conducted over conductor pairs 5,6 and 3,4 to a first gating means 12 and a second gating means 14, respectively.

The first gating means 12 is responsive to a second control signal S2, and the second gating means 14 is responsive to third control signal S3. The first gating means coveys charges applied to it over input lines 5 and 6 to output lines 7 and 8, resepectively. In similar fashion, the second gating means 14 conveys charges applied to it over input lines 3 and 4 to output lines 18 and 17, respectively.

Integrating means 16 receives at a first inpout thereto charges received over conductive pair 7, 17 and receives at a second input thereto charges received over conductive pair 8, 18. The first gating means and second gating means 14 are coupled to the inputs of the charge storage means 10 such that the polarity of the outputs of the charge storage means 10, as seen by the integrating means 16, coming from the first gating means 12, is reversed to that coming from the second gating means 14. Integrating means 16 produces an output VO at its output terminal 20.

Figure 2:
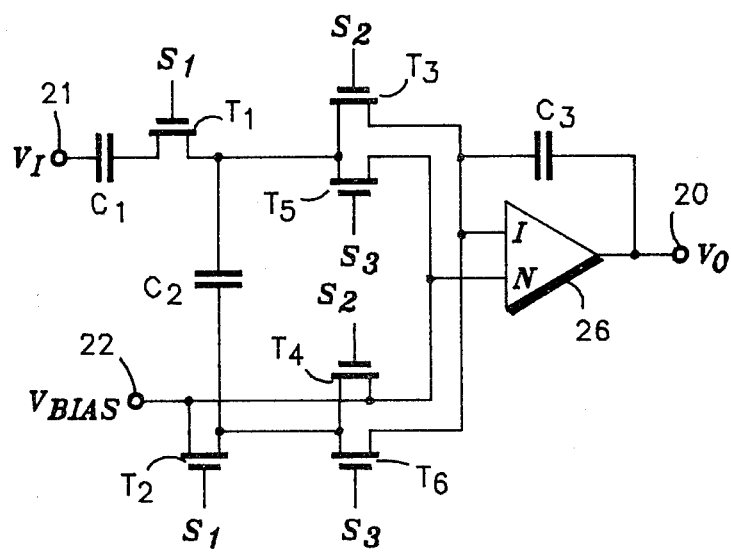
FIG. 2 shows a detailed circuit schematic of the combined phase detector and low pass filter of the present invention.

Referring now to FIG. 2, a detailed circuit diagram of a preferred embodiment of the combined phase detector and low pass filter is shown.

The circuit comprises an input terminal 21 for receiving an input signal VI, which may be an alternating current signal, and a voltage bias terminal to which an appropriate bias voltage VBIAS is applied.

Input terminal 21 is coupled to one side of a capacitor C1, the other side of which is coupled to the source terminal of an MOS transistor T1. Capacitor C1 functions as a DC blocking capacitor, blocking large low frequency signals from interfering with the input signal VI, thereby improving the performance of the circuit.

The drain terminal of transistor T1 is couple to one side of capacitor C2 and to the source terminals of transistors T3 and T5. Capacitor C2 has a value substantially less than that of capacitor C1.

The voltage bias terminal 22 is coupled to the source of transistor T2, to the drains of transistors T4 and T5, and to the non-inverting terminal N of operational amplifier 26. The other side of capacitor C2 is coupled to the drain terminal of transistor T2 and to the source terminals of transistors T4 and T6.

The drain terminals of transistors T3 and T5 are coupled together and to the inverting terminal I of operational amplifier 26. Operational amplifier 26 has an output 20 at which an output signal VO is generated. One side of a capacitor C3 is coupled to the output of operational amplifier 26, and the other side of capacitor C3 is coupled to the inverting input terminal I of operational amplifier 26.

A first control signal S1 is applied to the gate terminals of transistors T1 and T2. A second control signal S2 is applied to the gate terminals of transistors T3 and T4. A third control signal S3 is applied to the gate terminals of transistors T5 and T6. In a preferred embodiment of the invention the control signals are digital signals. They may be generated in any convenient way. For example, they may be produced digitally by frequency-dividing a clock frequency. Or they may be produced by analog means, as, for example, by utilising level sensing circuits responsive to a triangular or sinusoidal signal having a frequency equal to that of the second or third control signals, S2 or S3, respectively.

Figure 3:
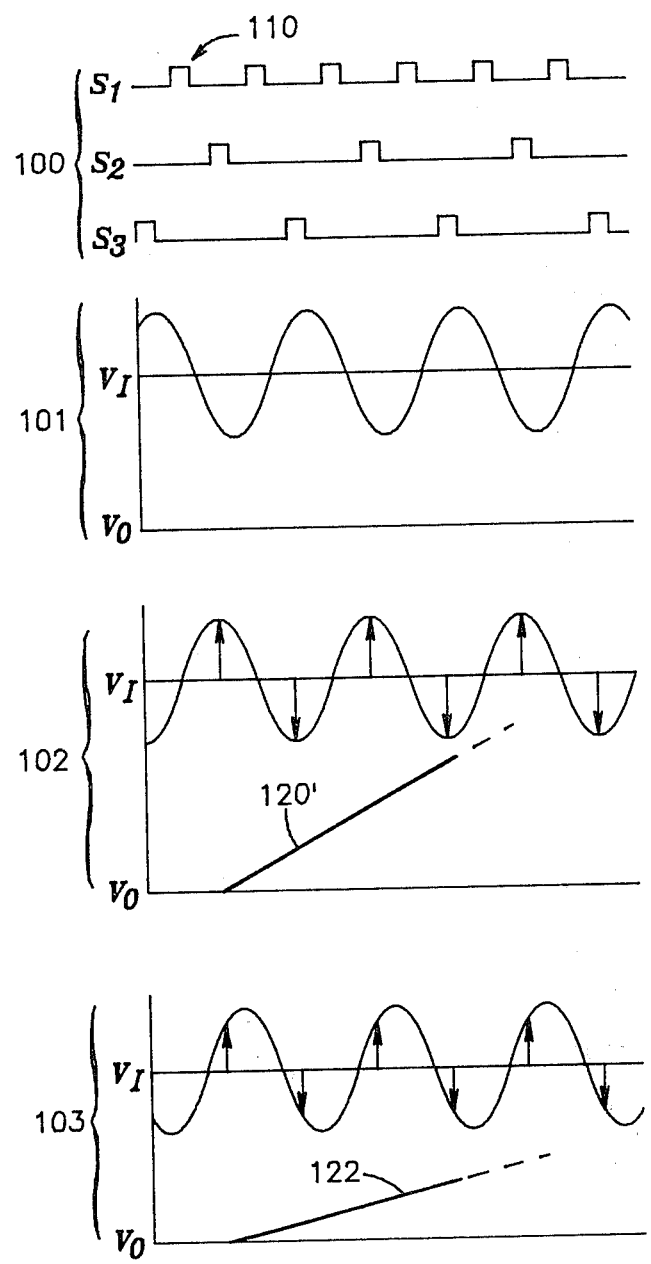
FIG. 3 shows various waveforms illustrating the operation of the present invention.

A preferred relationship between control signals S1-S3 is shown in portion 100 of FIG. 3. Control signals S2 and S3 have a frequency one-half that of control signal S1. The phase difference control signals S2 and S3 is 180 degrees. The digital pulses of control signals S2 and S3 occur midway between those of control signal S1 in an alternating fashion as shown in FIG. 3. The duty cycle of control signal S1 (i.e., that portion of its cycle when it is "ON") should be less than one-half of its period.

The operation of the preferred embodiment of the invention will now be described with reference to FIGS. 2 and 3. In FIG. 3 portion 100 depicts the relationship between control signals S1-S3, and portions 101, 102, and 103 show the relationship between a representative input signal VI and the resulting output signal VO for different phase relationships between the input signal VI and control signal S1.

In FIG. 3 the input signal VI is depicted as an alternating current signal of uniform frequency, although it should be realized by one of ordinary skill in the art that the present invention may operate as well upon input signals of variable frequency.

Portion 102 of FIG. 3 illustrates the output signal VO generated by the circuit for the condition when the frequency of the input signal VI is equal to one-half that of the first control signal S1, and when the falling edge 110 of the "ON" pulses of the first control signal S1 occur at the time of maximum amplitude of the input signal VI. The charge stored in the charge storage means 10 corresponds to the voltage amplitude of the input signal VI at the end of the sampling perod—i.e. when control signal S1 turns "OFF". The input signal VI received at input terminal 21 applied to capacitor C2 each time transistors T1 and T2 are rendered conductive by the "ON" pulses of control signal S1, so that the voltage developed across C2 reaches substantially that of the input signal VI at the end of each conductive period.

Capacitor C2 is alternatively discharged into the integrating circuit 26 via the MOS transistor pairs T3, T4 and T5, T6, in response to the second and third control signals, respectively. In this manner the sense of polarity in which the potential stored in C2 is connected to the integrating circuit 26 alternates.

For the condition illustrated by portion 102 of FIG. 3 capacitor C2 will be charged alternatively in the positive and negative polarity to equal amplitudes. The exact amplitude depends upon the relative phases of the input signal and the first control signal. Between the charging periods, capacitor C2 is discharged into the integrating circuit 26, and since the polarity of the connections between them is alternated, the integrating circuit 26 will be charged always in the same sense and will thus accumulate a charge, the magnitude of which is dependent upon the amplitude of the input signal VI at the end of the sampling period and upon the relative phase between the input signal VI and the first control signal S1. The output signal VO shown as line 120 in portion 102 of FIG. 3 is shown to gradually increase in magnitude at a rate corresponding to the charge accumulated in capacitor C2.

Portion 103 of FIG. 3 illustrates the condition when the input signal VI is sampled at a time which does not coincide with the maximum amplitude of signal VI. The corresponding output signal VO shown as line 122 is shown to increase in magnitude at a rate which is somewhat less than that of the output signal in portion 102.

Portion 101 of FIG. 3 illustrates the condition when the input signal VI is sampled at its zero-crossing points, and the output voltage VO is thus shown to be of zero magnitude.

If the input signal frequency differs from that of one-half the first control frequency, the potential to which C2 is successively charge varies at a frequency which is equal to the difference between the input signal and one-half the first control signal. The integrating circuit output VO will reproduce this "beat note" frequency without any steady or steadily increasing component.

It will be understood by one of ordinary skill in the art that the hereindisclosed circuit also functions as a low pass filter. Capacitor C2 together with the integrating means function essentially as a switched capacitive filter. The filter transfer characteristic can be derived as follows:

Let us assume $C_1 >>> C_2$

Capacitor C2 is charged to VI twice per cycle. Hence the output voltage of the integrator may be expressed by.

$$\frac{dVO}{dt} = -\frac{VI\, 2f\, C2}{C3} \quad (1)$$

Expressed in Laplace Transform notation the transfer function is, $$G(s) = -\frac{1}{S\tau} \quad (2)$$

where $\tau = \frac{C3}{2fC2}$ and where $2f$ is the frequency of the first control signal S1.

It will be noted that the integrating circuit 26 does not receive any signals at the frequency of the input signal. The phase detector is thus of the so-called "double balanced" type.

It will be apparent to those skilled in the art that the disclosed Combined Phase Detector and Low Pass Filter may be modified in numerous ways and may assume many embodiments other than the preferred form specifically set out and descirbed above.

For example, the DC blocking capacitor C1 may be eliminated, if desired, at the expense of a certain degree of circuit performance.

It will also be appreciated that the integrating circuit 26 may be modified in various ways so that other filter characteristics may be obtained. For example, an R-C network could be utilised to modify the transfer function of the circuit.

Accordingly, it is intended by the appended claims to cover all modifications of the invention which fall within the true spirit and scope of the invention.

What is claimed is:

1. A combined phase detector and low pass filter comprising:
   charge storage means (10) responsive to an input signal and to a first control signal, said first control signal having a first frequency;
   first gating means (12) coupled to the charge storage means output signals for gating or blocking such signals in response to a second control signal;
   second gating means (14) coupled to the charge storage means output signals for gating or blocking such signals in response to a third control signal, said second and third control signals being 180 degrees out of phase with respect to each other; and
   integrating means (16) having first and second input terminals coupled to each of said first and second gating means said terminals being responsive to the charge storage means output signals when such signals are gated by the first and second gating means, said integrating means integrating the signals applied to its input terminals and generating an output signal (VO), the magnitude of said output signal being indicative of the phase difference between the input signal and the first control signal.

2. The invention as recited in claim 1 wherein said input signal is an alternating current signal.

3. The invention as recited in claim 1 wherein the second and third control signals have a frequency one-half that of the first control signal.

4. The invention as recited in claim 3 wherein the duty cycle of the first control signal is less than half of its period.

5. The invention as recited in claim 3 wherein the first, second, and third control signals are represented by series of digital pulses, the pulses of said second and third control signals occurring alternatingly half-way between the pulses of the first control signal.

6. The invention as recited in claim 1 wherein said charge storage means comprises a capacitor, said first and second gating means each comprise at least one MOS transistor, and said integrating means comprises an operational amplifier.

7. The invention as recited in claim 6, wherein said second and third control signals are applied to the gates of at least one MOS transistor of said first and second gating means respectively.

8. A combined phase detector and low pass filter comprising:
   an input terminal responsive to an alternating current input signal;
   a DC voltage supply;
   first and second MOS transistors each having a source, drain, and gate, the sources of said first and second MOS transistors being coupled to said input terminal and to said DC voltage supply, respectively;
   the gates of said first and second MOS transistors being responsive to a first control signal;
   first capacitive means coupled between the drains of said first and second MOS transistors;
   third and fourth MOS transistors each having a source, drain, and gate, the sources of said third and fourth MOS transistors being coupled to the drains of said first and second MOS transistors respectively, and the gates of said third and fourth MOS transistors being responsive to a second control signal;
   fifth and sixth MOS transistors each having a source, drain and gate, the sources of said fifth and sixth MOS transistors being coupled to the drains of said first and second MOS transistors, respectively, and the gates of said fifth and sixth MOS transistors being responsive to a third control signal;
   an integrating circuit comprising an operational amplifier having an inverting input terminal, a non-inverting input terminal, and an output terminal, the output terminal being coupled to said inverting input terminal by second capacitive means, said non-inverting input terminal being coupled to the drains of said fourth and fifth MOS transistors, said inverting input terminal being coupled to the drains of said third and sixth MOS transistors;
   said, first, second and third control signals being digital signals, the frequency of said second and third control signals being one-half that of the first control signal, and the phase difference between said second and third control signals being 180 degrees;
   whereby said integrating circuit generates at said output terminal an output signal having a magnitude increasing at a rate indicative of the phase difference between said input signal and said first control signal.

9. The invention as recited in claim 8, further comprising third capacitive means coupled between said input terminal and the source of said first MOS transistor.

10. The invention as recited in claim 8, wherein the duty cycle of said first control signal is less than one-half its period.

11. The invention as recited in claim 8, wherein the times when said second and third control signals are "ON" occur alternatingly between successive times when said first control signal is "ON".

12. A combined phase detector and low pass filter fabricated as an integrated circuit on a single substrate and comprising:
   charge storage means (10) responsive to an input signal and to a first control signal, said first control signal having a first frequency, said charge storage means having first and second output signals of opposite polarity;
   first gating means (12) coupled to the charge storage means output signals for gating or blocking such signals in response to a second control signal, said second control signal having a frequency one-half the frequency of the first control signal;

second gating means (14) coupled to the charge storage means output signals for gating or blocking such signals in response to a third control signal, said third control signal having a frequency one-half that of the first control signal, said second and third control signals being 180 degrees out of phase with respect to each other; and integrating means (16) having first and second input terminals coupled to each of said first and second gating means, said terminals being responsive to the charge storage means output signals when such signals are gated by the first and second gating means, the connection of the charge storage means output signals to the integrating means input terminals being reversed in polarity through said first and second gating means, said integrating means integrating the signals applied to its input terminals and generating an output signal (VO), the magnitude of said output signal being indicative of the phase difference between the input signal and the first control signal.

13. The invention as recited in claim 12 wherein said input signal is an alternating current signal.

14. The invention as recited in claim 12 wherein the first, second, and third control signals are digital signals.

15. The invention as recited in claim 14 wherein the duty cycle of the first control signal is less than half of its period.

16. The invention as recited in claim 14 wherein the first, second, and third control signals are represented by series of digital pulses, the pulses of said second and third control signals occurring alternatingly half-way between the pulses of the first control signal.

17. The invention as recited in claim 12 wherein said charge storage means comprises a capacitor, said first and second gating means each comprise at least one MOS transistor, and said integrating means comprises an operational amplifier.

18. The invention as recited in claim 17, wherein said second and third control signals are applied to the gate of at least one MOS transistor of said first and second gating means respectively.

* * * * *